(12) United States Patent
Ikuno et al.

(10) Patent No.: US 6,599,670 B2
(45) Date of Patent: Jul. 29, 2003

(54) METHOD FOR COMPENSATING EXPOSURE VALUE FOR EXPOSURE PROCESS IN SEMICONDUCTOR MANUFACTURING SYSTEM

(75) Inventors: Masao Ikuno, Tokyo (JP); Masahiko Kishi, Tokyo (JP); Masaaki Yomo, Hiroshima (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/866,617

(22) Filed: May 30, 2001

(65) Prior Publication Data

US 2002/0009657 A1 Jan. 24, 2002

(30) Foreign Application Priority Data

May 30, 2000 (JP) ........................................ 2000-159933

(51) Int. Cl.[7] ................................................. G03F 9/00
(52) U.S. Cl. ........................................................ 430/30
(58) Field of Search ............................................ 430/30

(56) References Cited

U.S. PATENT DOCUMENTS 5,409,538 A 4/1995 Nakayama et al. ......... 118/688

FOREIGN PATENT DOCUMENTS

JP 08172046 7/1996

Primary Examiner—Christopher G. Young
(74) Attorney, Agent, or Firm—Young & Thompson

(57) ABSTRACT

A method of determining an exposure value for exposing a resist film, comprises the steps of: estimating a size variation of a resist pattern from a predetermined target size based on a waiting time of a currently processing resist film to be patterned in subsequent sequential exposure and development processes; and compensating a reference exposure value based on said size variation to obtain a compensated exposure value.

14 Claims, 5 Drawing Sheets

SEMICONDUCTOR MANUFACTURING SYSTEM

METHOD FOR COMPENSATING EXPOSURE VALUE FOR EXPOSURE PROCESS IN SEMICONDUCTOR MANUFACTURING SYSTEM

BACKGROUND OF THE INVENTION

1. Field of the Invention

The present invention relates to an exposure system and an exposure method for forming a semiconductor device, and more particularly to a method and a system for controlling an exposure value in an exposure system and an exposure method to reduce variation of a resist pattern size.

2. Description of the Related Art

A lithography process is used for forming a semiconductor device. A resist film is applied by an applicator onto a semiconductor wafer surface, and the resist film is then baked, before an exposure and a subsequent development are carried out. After the applied resist film is previously baked, it is actually needed to take a waiting time for starting the subsequent exposure process. In this application, the word "Waiting time" is defined to be a time duration after a pre-baking process for the applied resist film and until an exposure process is started. For this waiting time, the wafer is stoked between the applicator and the exposure system. This waiting time is variable for individual carrier units for matching the timings among the sequential processes.

It has been know that variation in waiting time of the wafer causes variation in size or dimension of the resist pattern after the exposure and development processes. FIG. 1 is a diagram illustrative of various sizes of a photo-resist pattern versus waiting time. The size of the photo-resist pattern is variable. As the waiting time increases, an averaged size of the photo-resist pattern tends to increase. As the waiting time increases up to a time T1 from zero, the rate of increase in the averaged size of the photo-resist pattern is rapid. As the waiting time further increases from the time T1 and approaches a longer time T5, the rate of increase in the averaged A size of the photo-resist pattern becomes gentle. As the waiting time becomes much longer, the variation in size of the photo-resist pattern becomes small.

As may be seen from FIG. 1, the variation in waiting time of the wafer causes variation in size or dimension of the resist pattern after the exposure and development processes. The waiting time may be different between different carrier units of the wafers. Thus, the size or dimension of the resist pattern may be different between different carrier units of the wafers.

An excessive increase of the waiting time is effective in order to reduce the variation in size or dimension of the resist pattern, but also reduces the throughput of the wafer. For this reason, the excessive increase of the waiting time is undesirable practically.

It has also been known that the variation in size of the resist pattern may depend on not only variation of the waiting time but also variation in the atmospheric pressure. If the atmospheric pressure is reduced, then the thickness of the resist is increased. The variation in the atmospheric pressure causes variation in the atmospheric density, which further varies the refractive index of an optical lens to an air, resulting in variation in the focusing point.

FIG. 2 is a schematic block diagram of a conventional semiconductor manufacturing system for photo-lithography processes and subsequent anisotropic etching process. A system 201 includes a host 210, a photo-resist applicator 202, an exposure and development apparatus 203, a first size-measuring device 205, an etching apparatus 204, and a second size-measuring device 206. The first size-measuring device 205 measures the size of the photo-resist pattern immediately after the development process. The second size-measuring device 206 measures the size of the etched region of the wafer immediately after the etching process.

The size-measured results by the first and second size-measuring devices 205 and 206 are transmitted to the host 210. The host 210 changes, if any, resist application conditions for applying the resist film by the applicator 202 and also exposure conditions by the exposure and development apparatus 203, and further etching conditions by the etching apparatus 204.

The above conventional technique depends upon the past-measured pattern sizes manufactured in the past process, in order to set the conditions for the future wafers, namely, not responsible in real time to the variations in the waiting time and the atmospheric pressure. It is, therefore, difficult for the conventional technique to suppress the size variation of the wafer based on the variations in the waiting time and the atmospheric pressure.

Japanese laid-open patent publication No. 8-172046 discloses that various data about a pre-baking termination time, wafer not numbers, and the kinds of the wafer resist are transmitted from a storage device through a data transmitter to an exposure controller, so that the exposure controller calculates the waiting time of the wafers based on the transmitted data in order to set an appropriate exposure value based on the calculated waiting time. This conventional technique avoids that the size of the resist patterns varies depending on the waiting time.

The above conventional technique of the above Japanese publication also depends upon the past-measured pattern sizes manufactured in the past process, in order to set the conditions for the future wafers, namely, not responsible in real time to the variations in the waiting time and the atmospheric pressure. It is, therefore, difficult for the conventional technique to suppress the size variation of the wafer based on the variations in the waiting time and the atmospheric pressure.

Consequently, the above two conventional techniques determine the exposure value for the resist film based on the past waiting time of the past-processed wafers in the past processes, without considering the current waiting time of the current wafer to be processed from now.

In the above circumstances, the development of a novel exposure system and exposure method free from the above problems is desirable.

SUMMARY OF THE INVENTION

Accordingly, it is an object of the present invention to provide a novel exposure system free from the above problems.

It is a further object of the present invention to provide a novel method of determining an exposure value free from the above problems.

The present invention provides a method of determining an exposure value for exposing a resist film, comprising the steps of: estimating a size variation of a resist pattern from a predetermined target size based on a waiting time of a currently processing resist film to be patterned in subsequent sequential exposure and development processes; and compensating a reference exposure value based on said size variation to obtain a compensated exposure value.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
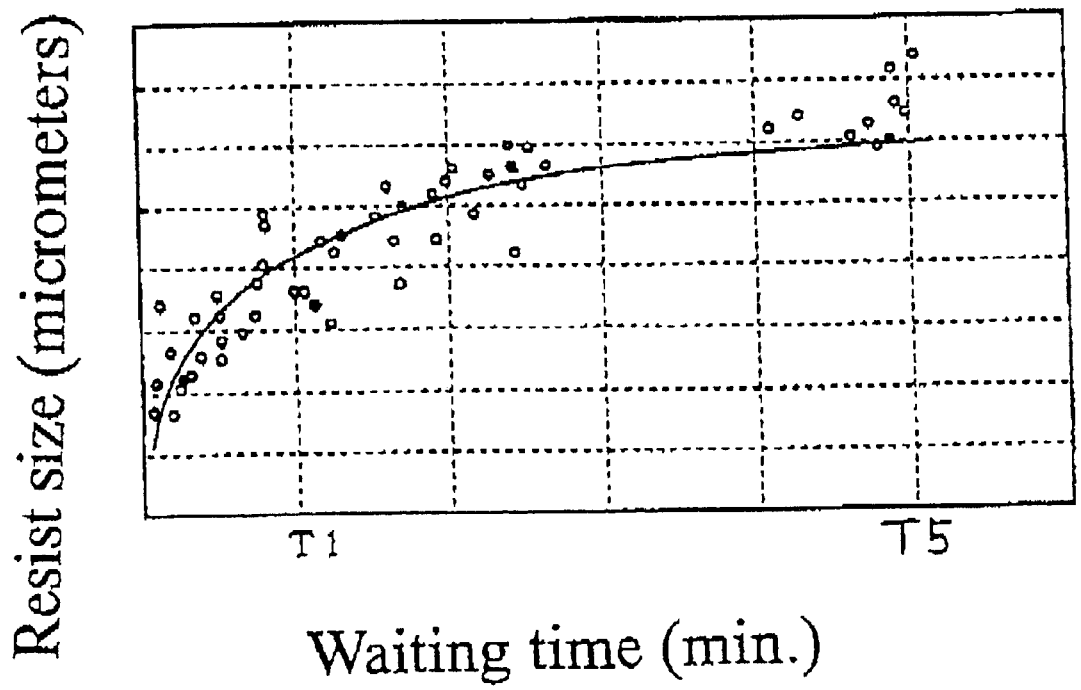
FIG. 1 is a diagram illustrative of various sizes of a photo-resist pattern versus waiting time.
Figure 2:
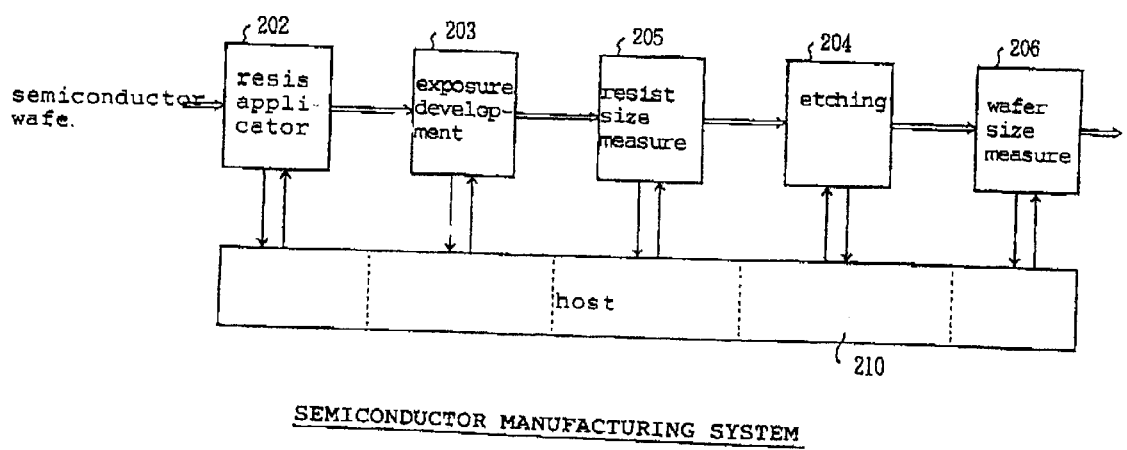
FIG. 2 is a schematic block diagram of a conventional semiconductor manufacturing system for photo-lithography processes and subsequent anisotropic etching process.
Figure 3:
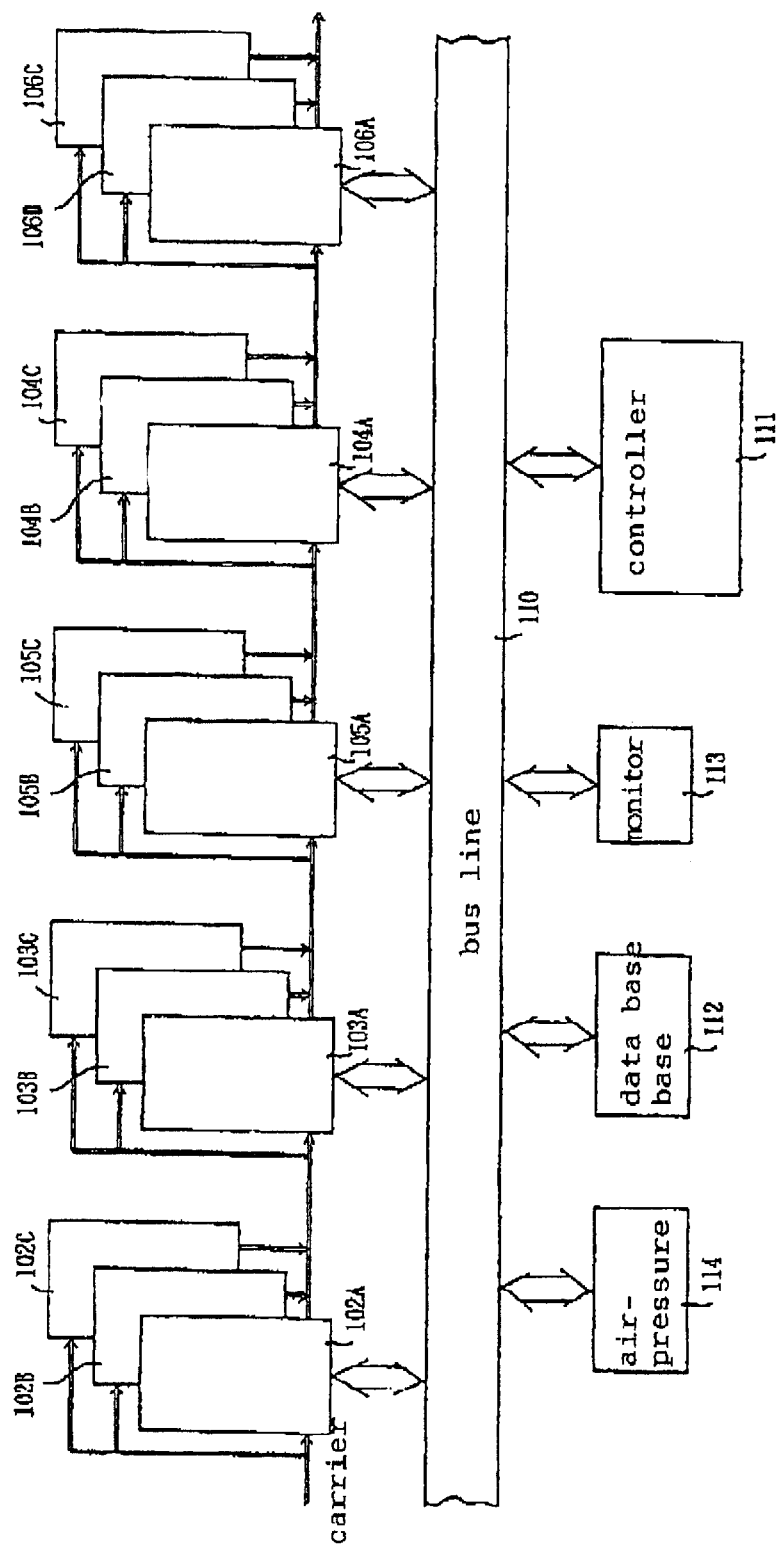
FIG. 3 is a block diagram of a system for manufacturing a semiconductor device in a first embodiment in accordance with the present invention.

A first embodiment according to the present invention will be described in detail with reference to FIG. 3. A system 101 may include first, second and third resist-applicators 102A, 102B and 102C, each of which applies a resist film on a semiconductor wafer and then pre-bakes the applied resist film. The system 101 may also include first, second, and third exposure and development apparatuses 103A, 103B and 103C, each of which carries out an exposure and subsequent development processes for patterning said resist film. The exposure process may be carried out by using optionally selected one of beams of various types such as ultraviolet ray, X-ray and electron beam.

The system 101 may also include first, second, and third etching apparatuses 104A, 104B and 104C for anisotropically etching said wafer with said resist pattern. The system 101 may also include first, second, and third resist-pattern-size measuring apparatuses 105A, 105B and 105C for measuring a size of the resist pattern over said wafer. The first, second, and third resist-pattern-size measuring apparatuses 105A, 105B and 105C may have follower positions to the first, second, and third exposure and development apparatuses 103A, 103B and 103C. The system 101 may also include first, second, and third wafer-pattern-size measuring apparatus 106A, 106B and 106C for measuring a size of the wafer pattern defined by the etching process using the resist pattern. The first, second, and third wafer-pattern-size measuring apparatus 106A, 106B and 106C may have follower positions to the first, second, and third etching apparatuses 104A, 104B and 104C.

A plurality of wafers may be carried by a single carrier for batch-processing plural wafers concurrently in a lot unit in the order of the resist-applicators 102A, 102B and 102C, the exposure and development apparatuses 103A, 103B and 103C, the resist-pattern-size measuring apparatuses 105A, 105B and 105C, the etching apparatuses 104A, 104B and 104C, the wafer-pattern-size measuring apparatus 106A, 106B and 106C.

The system 101 may also include a bus line 110 which is connected in parallel to the resist-applicators 102A, 102B and 102C, the exposure and development apparatuses 103A, 103B and 103C, the resist-pattern-size measuring apparatuses 105A, 105B and 105C, the etching apparatuses 104A, 104B and 104C, the wafer-pattern-size measuring apparatus 106A, 106B and 106C. The bus line 110 may transfer data. The bus line 110 may receive work history data from each of the resist-applicators 102A, 102B and 102C, the exposure and development apparatuses 103A, 103B and 103C, and the etching apparatuses 104A, 104B and 104C after the individual process has been made. The bus line 110 may receive measured data from each of the resist-pattern-size measuring apparatuses 105A, 105B and 105C, and the wafer-pattern-size measuring apparatuses 106A, 106B and 106C. Each of the exposure and development apparatuses 103A, 103B and 103C may receive the compensated exposure value, so that the exposure process is carried out based on the compensated exposure value.

The system 101 may also include a controller 111, a data base 112, a monitor 113 and an atmospheric pressure measuring apparatus 114, which are connected in parallel to the bus line 110. The data base 112 stores work history data, size-measured data and read exposure values. The work history data are transferred through the bus line 110 from each of the resist-applicators 102A, 102B and 102C, the exposure and development apparatuses 103A, 103B and 103C, and the etching apparatuses 104A, 104B and 104C. The resist pattern size measured data may be transferred through the bus line 110 from each of the resist-pattern-size measuring apparatuses 105A, 105B and 105C. The wafer pattern size measured data may be transferred through the bus line 110 from each of the wafer-pattern-size measuring apparatuses 106A, 106B and 106C.

The controller 111 may fetch the work history data, the resist pattern size measured data and the wafer pattern size measured data through the bus line 110 from the data base 112, so that the controller 111 calculates a compensated exposure value based on the fetched data. The data of calculated compensated exposure values are transferred through the bus line 110 to the data base 112 for storing the data into the data base 112. The process for calculating the compensated exposure value will be described below.

The monitor 113 may monitor data about the compensated exposure values stored in the data base 112 for analysis for those data in below-mentioned processes, in order to verify whether the compensated exposure value is within a predetermined acceptable range. If the compensated exposure value is within the predetermined acceptable range, then the monitor 113 renders the compensated exposure value effective. If the compensated exposure value is not within the predetermined acceptable range, then the monitor 113 renders the compensated exposure value ineffective.

The atmospheric pressure measuring apparatus 114 may measure an atmospheric pressure at a position of the exposure and development apparatuses 103A, 103B and 103C for transmitting data about the measured atmospheric pressures through the bus line 110 to the data base 112 for storing the data in the data base 112. The atmospheric pressure measuring apparatus 114 continuously measures the pressure and renews the atmospheric pressure data for every constant time periods. The atmospheric pressure measuring apparatus 114 may optionally measure other positions of the other apparatus such as the applicators, the measuring apparatuses and the etching apparatus.

Figure 4:
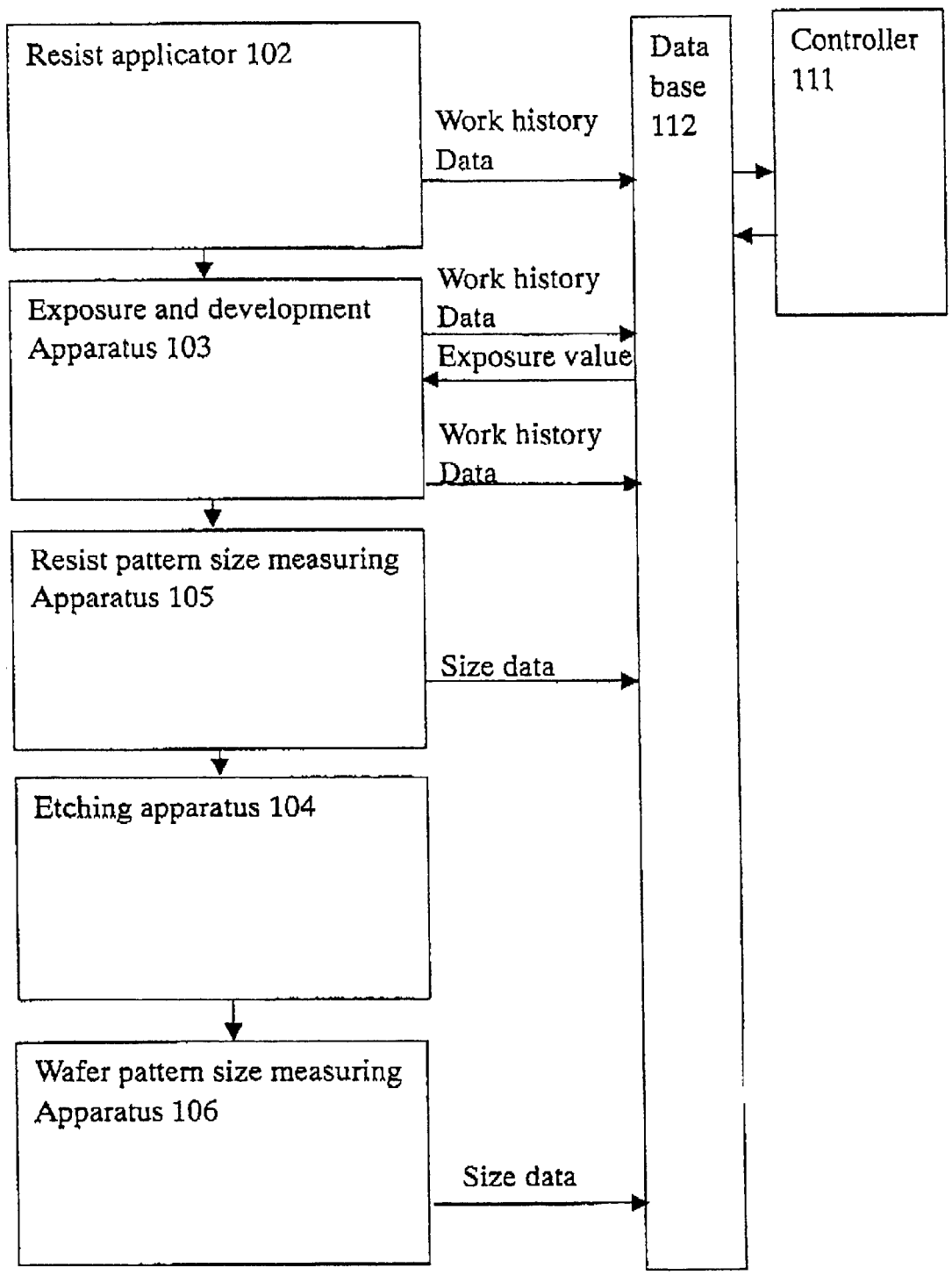
FIG. 4 is a view of individual processes in individual apparatuses included in the system of FIG. 3.

The wafers are parallel-processed by the above first, second and third manufacturing apparatuses. The manufacturing processes by the above described system 101 will be described with reference to FIG. 4. Each of the first, second and third resist applicators 102A, 102B and 102C picks up a single wafer from the wafer carrier which contains plural wafers, and applies a resist film on the wafer surface, before pre-bakes the resist film. The wafer with the pre-baked resist film is then contained in the wafer carrier. After all of the wafers in the wafer carrier have been processed by the first, second and third resist applicators 102A, 102B and 102C, then the wafer carrier is carried toward the first, second and third exposure and development apparatuses 103A, 103B and 103C. At the same time, the work history data may also be transferred through the bus line 110 to the data base 112 for storing the same, wherein the work history data may include a carrier data for indicating a carrier for carrying the wafers, a resist data for indicating the kind of the resist film, a process data for indicating the kind of processes, and an output time data for the output time when the carrier is outputted from the applicators 102A, 102B and 102C.

The wafer is carried to the first, second and third exposure and development apparatuses 103A, 103B and 103C. The first, second and third exposure and development apparatuses 103A, 103B and 103C may fetch various wafer-related data based on the carrier ID data from the data base 112 through the bus line 110, prior to the exposure process, so that the first, second and third exposure and development apparatuses 103A, 103B and 103C may receive selected ones or all of the available informations about the wafers to be processed before the exposure process.

Each of the first, second and third exposure and development apparatuses 103A, 103B and 103C picks up a single wafer from the wafer carrier and carries out the compensated exposure value. Usually, the exposure and development apparatus has been set to have a predetermined constant intensity of exposure beam, for which reason the exposure value may be controlled by controlling an exposure time period. Namely, each of the first, second and third exposure and development apparatuses 103A, 103B and 103C may set the exposure time period based on the compensated exposure value for carrying out the exposure process with the controlled exposure time period.

Subsequently, each of the first, second and third exposure and development apparatuses 103A, 103B and 103C may carry out the development process to form a resist pattern over the wafer. This processed wafer is then contained in the carrier. After all of the wafers in the carrier have been processed, then the carrier is carried toward the resist-pattern-size measuring apparatuses 105A, 105B and 105C. At the same time, the first, second and third exposure and development apparatuses 103A, 103B and 103C output the work history data which include the carrier ID data for indicating the carrier of the processed wafers, an exposure and development apparatus indicating data for indicating operated one of the first, second and third exposure and development apparatuses 103A, 103B and 103C, an exposure value data for the exposure value, an exposure time data for indicating when the exposure process is carried out. The work history data are transferred through the bus line 110 to the data base 112.

The wafer carrier is then carried to the first, second and third resist-pattern-size measuring apparatuses 105A, 105B and 105C. Each of the first, second and third resist-pattern-size measuring apparatuses 105A, 105B and 105C picks up a single wafer for measuring a resist pattern size of the wafer. The measured size data of the wafers are then transferred through the bus line 110 to the data base 112.

The wafer carrier is further carried to the first, second and third etching apparatuses 104A, 104B and 104C. Each of the first, second and third etching apparatuses 104A, 104B and 104C picks up a single wafer for etching the wafer by use of the resist pattern as a mask.

After all of the wafers in the carrier are etched, then the carrier is carried toward the first, second, and third wafer-pattern-size measuring apparatus 106A, 106B and 106C. Each of the first, second, and third wafer-pattern-size measuring apparatus 106A, 106B and 106C picks up a single wafer for measuring a size of the wafer pattern defined by the etching process using the resist pattern.

Figure 5:
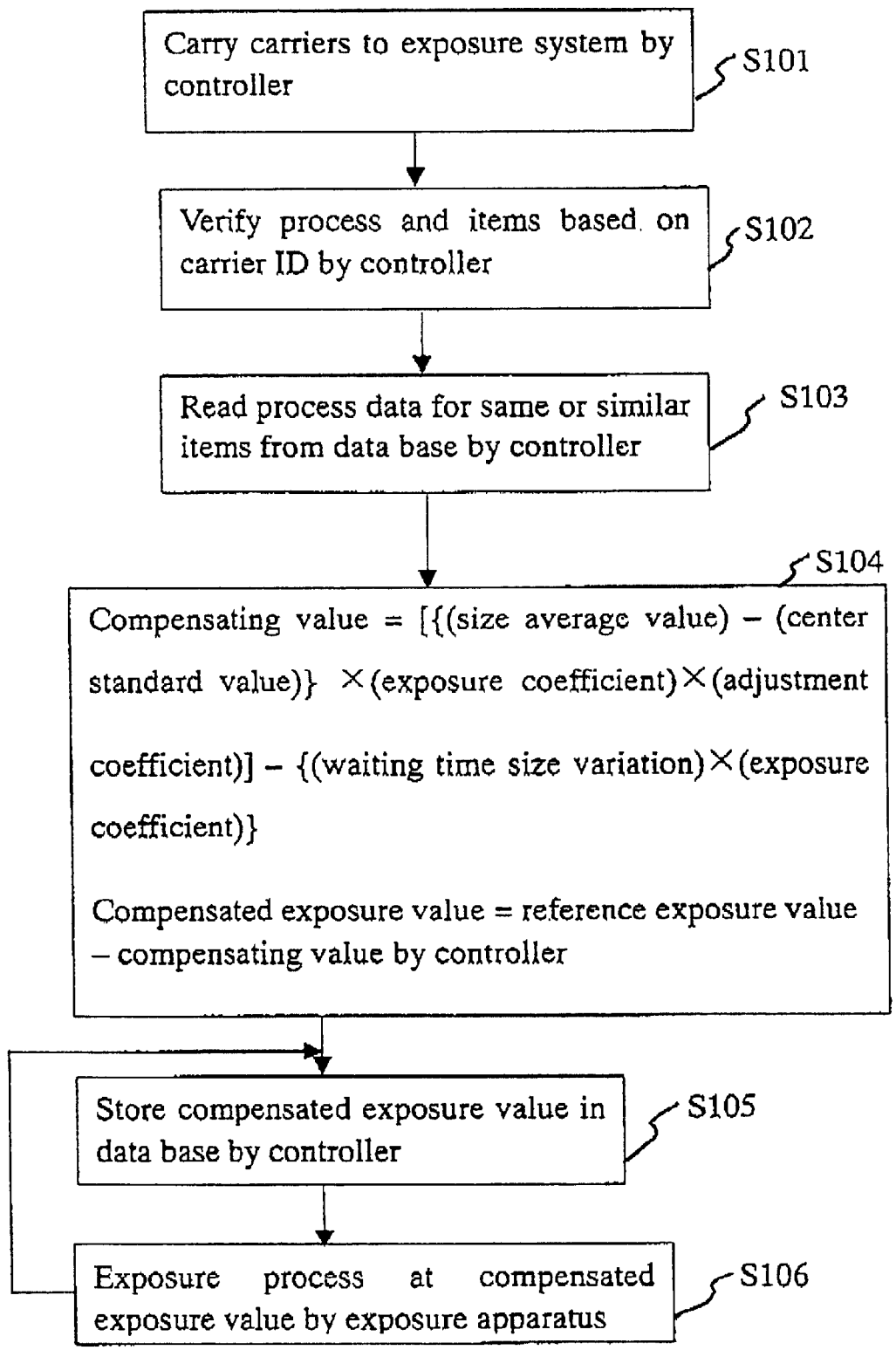
FIG. 5 is a flow chart of individual steps involved in the exposure process of FIG. 4.

The above exposure process by the first, second and third exposure and development apparatuses 103A, 103B and 103C will be described in detail with reference to FIG. 5.

In a step S101, the carriers are carried to the first, second and third exposure and development apparatuses 103A, 103B and 103C.

In a step S102, the controller 111 fetches the work history data stored in the data base 112, wherein the work history data had already been given to the data base 112 from the first, second and third exposure and development apparatuses 103A, 103B and 103C in the past exposure processes. The controller 111 recognizes carrier ID data from the fetched data and also inquires a line system with the carrier ID to recognize process items of the carrier.

In a step S103, the controller 111 may retrieve, from the data base 112, work history data when the currently processing carrier has been outputted from the resist applicator 102 and process data about the same and similar past items, so that the controller 111 may read data which indicate the kind of the resist film, data which indicates the type of process, and the carrying time, based on the retrieved data.

In a step S104, the controller 111 may calculate a compensated exposure value for processing the wafers in the currently processing wafer carrier based on those just obtained data and the data previously stored in the data base 112.

Operations of calculating the compensated exposure value will be described in detail.

In a step S104a, the controller 111 calculates a compensating value for compensation to the reference exposure value. The reference exposure value is defined to be an averaged value of past real exposure values which have been compensated based on the measured size of the resist pattern or the processed wafer pattern for making the resist pattern size correspond to the designed size. The compensating value is a compensating time for adjusting the exposure time.

The compensating value may be calculated by the following equations.

Compensating value=[{(size average value)−(center standard value)}×(exposure coefficient)×(adjustment coefficient)]−{(waiting time size variation)×(exposure coefficient)}

(a) size average value is an averaged value of the wafer pattern sizes of the past semiconductor wafers;

(b) center standard value is a target wafer pattern size of the semiconductor wafer;

(c) exposure coefficient is the exposure value when the resist pattern size is varied by 1 micrometers.

(d) adjustment coefficient is the value designed based on a pattern size variation tendency which has been obtained experimentally from the kind of resist film, the kind of the exposure apparatus, and the characteristics of the exposure apparatus.

(e) waiting time size variation is a time-dependent variation in size of the resist pattern, which depends on the waiting time.

The size average value, the center standard value, the exposure coefficient, the adjustment coefficient and the waiting time size variation may be obtained from the past processes for the semiconductor wafers, and also have been stored in the data base 112.

The controller 111 read out, from the data base, the size average value, the center standard value, the exposure coefficient, the adjustment coefficient and the waiting time size variation. Further, the controller 111 calculates the waiting time from the work history data from the resist applicator 102 and the carrying time data for the time when the carrier is carried to the exposure and development apparatus. The waiting time size variation is obtained based on the waiting time. The exposure coefficient and the adjustment coefficient are respectively obtained based on the work history data and the exposure process data. The the size average value, the center standard value, the exposure coefficient, the adjustment coefficient and the waiting time size variation are incorporated into the above equation to obtain the compensating value.

In a step S104b, the compensated exposure value is obtained by subtracting the compensating value from the reference exposure value.

compensated exposure value=[(reference exposure value)−(compensating value)]

The reference exposure value is an averaged value of the real exposure values for past-processing the same and/or similar items.

In a step S105, the compensated exposure value is transferred through the bus line 110 to the data base 112.

In a step S106, the exposure and development apparatus 103 carries out the exposure process at a controlled exposure time period which depending on the compensated exposure value.

This compensated exposure value was based on the data obtained immediately after the operations by the controller 111. Namely, the compensated exposure value was based on the resist pattern size data of the prior semiconductor wafers measured by the resist-pattern-size measuring apparatuses 105 and also based on the wafer pattern size data of the prior semiconductor wafers measured by the wafer-pattern-size measuring apparatuses 106. The compensation to the exposure value may be realized by real time base.

The above sequential steps S105 and S106 are repeated for processing all of the wafer carriers.

All of the data outputted from the resist applicators 102, the exposure and development apparatuses 103, the etching apparatuses 104, the resist-pattern-size measuring apparatuses 105 and the wafer-pattern-size measuring apparatuses 106 are stored in the data base 112. The controller 111 may calculate the compensated exposure value based on the updated data in the data base 112 in order to realize a real-time response to the size variation due to the variable waiting time. This allows a highly accurate pattern size of the semiconductor wafer. Particularly, if the exposure process is carried out immediately after the resist film is applied on the wafer surface, then the exposure process at the compensated exposure value may avoid the resist pattern size variation. It is unnecessary for reducing the resist pattern size variation to take a long waiting time for subsequent exposure process for the pre-baked wafer. This means it possible to increase the throughput.

Optionally, it is possible that the compensated exposure value may be calculated in further consideration of an atmospheric pressure data measured by the atmospheric pressure measuring apparatus 114. The measured atmospheric pressure is transferred through the bus line 110 to the data base 112, and the atmospheric pressure data is stored therein. The controller 111 may read out the current pressure data from the data base 112 for compensating the current pressure data to a reference pressure data to obtain a pressure difference between them. The compensating value may be calculated in further reference to the pressure difference. The drop of the pressure increases the thickness of the resist film.

Variation in pressure causes variation in refractive index of the optical system of the exposure apparatus, whereby a focusing position is varied. Those factors vary the resist pattern size. The possible pattern size variation is estimated based on the variation of the atmospheric pressure and the compensating value to the reference exposure value is calculated based on not only the above variable factors but also the atmospheric pressure variation.

The monitor 113 continuously monitors the individual data stored in the data base 112 for analysis to the data. The monitor 113 refers the past compensated exposure values for the same or similar items and processes to obtain an averaged compensated exposure value. The monitor 113 verifies whether the currently calculated compensated exposure value is within a predetermined acceptable range, which has a center value corresponding to the averaged compensated exposure value. The predetermined acceptable range may, for example, be −10% to +10%.

If the currently calculated compensated exposure value is not within the predetermined acceptable range, then the monitor 113 renders the currently calculated compensated exposure value ineffective for inhibiting the controller 111 to use the currently calculated compensated exposure value, and in place instructs the controller 111 to select the past-calculated compensated exposure value. The exposure and development apparatus 103 carries out the exposure process at the past-calculated compensated exposure value.

If the currently calculated compensated exposure value is not within the predetermined acceptable range, then the monitor 113 renders the currently calculated compensated exposure value effective for enabling the controller 111 to use the currently calculated compensated exposure value, whereby the exposure and development apparatus 103 carries out the exposure process at the currently calculated compensated exposure value.

In the above-described embodiment, the wafer carrier is an unit for the individual processes for batch-processing the plural wafers. It is, however, possible to apply the present invention to a single wafer process system, wherein the wafers are separately processed. In this case, the compensating value for compensating the reference exposure value is obtained based on the last-updated data stored in the data base. This allows the resist pattern to have a highly accurate size.

In the in-line system for flow processes, if a part of the in-line system has a fault and the sequential processes are temporally discontinued, the waiting time is unexpectedly long. In this case, the present invention is effective to avoid the pattern size variation.

In the above-described embodiment, the system includes the unitary formed exposure and development apparatus which carry out both sequential exposure and development processes. It is, of course, possible to apply the present invention to another system which includes an exposure apparatus and a development apparatus separately.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of determining an exposure value for exposing a resist film, comprising the steps of:

estimating a size variation of a resist pattern from a predetermined target size based on a waiting time of a currently processing resist film to be patterned in subsequent exposure process; and compensating a reference exposure value based on said size variation to obtain a compensated exposure value.

2. The method as claimed in claim 1, wherein said reference exposure value is determined based on an averaged value of past real exposure values for selected wafers having same or similar item to said currently processing wafer.

3. The method as claimed in claim 1, wherein said size variation of said resist pattern is estimated with further reference to a measured pattern size average value of past-processed wafers, and said predetermined target size.

4. The method as claimed in claim 3, wherein said size variation of said resist pattern is estimated with further more reference to an exposure coefficient and an adjustment coefficient.

5. The method as claimed in claim 4, wherein said size variation of said resist pattern is estimated with further more reference to a currently measured atmospheric pressure.

6. The method as claimed in claim 1, wherein said waiting time is determined between an output time of a currently processing wafer with said currently processing resist film from a resist film applicator and an input time of said currently processing wafer into an exposure and development apparatus.

7. The method as claimed in claim 1, further comprising steps of;

verifying whether said compensated exposure value is within a predetermined acceptable range having a center value which corresponds to an averaged value of past real exposure values for selected wafers having same or similar item to said currently processing wafer;

rendering said compensated exposure value effective if said compensated exposure value is within said predetermined acceptable range; and rendering said compensated exposure value ineffective and determining to use a past-real used one of compensated exposure values if said compensated exposure value is not within said predetermined acceptable range.

8. A method of compensating an exposure time period for an exposure process at a predetermined constant exposure beam intensity, said method comprising the steps of:

estimating a size variation of a resist pattern from a predetermined target size based on a waiting time of a currently processing resist film to be patterned in subsequent exposure process; and compensating a reference exposure time period based on said size variation to obtain a compensated exposure time period.

9. The method as claimed in claim 8, wherein said reference exposure time period is determined based on an averaged value of past real exposure time periods for selected wafers having same or similar item to said currently processing wafer.

10. The method as claimed in claim 8, wherein said size variation of said resist pattern is estimated with further reference to a measured pattern size average value of past-processed wafers, and said predetermined target size.

11. The method as claimed in claim 10, wherein said size variation of said resist pattern is estimated with further more reference to an exposure coefficient and an adjustment coefficient.

12. The method as claimed in claim 11, wherein said size variation of said resist pattern is estimated with further more reference to a currently measured atmospheric pressure.

13. The method as claimed in claim 8, wherein said waiting time is determined between an output time of a currently processing wafer with said currently processing resist film from a resist film applicator and an input time of said currently processing wafer into an exposure and development apparatus.

14. The method as claimed in claim 8, further comprising steps of verifying whether said compensated exposure value is within a predetermined acceptable range having a center value which corresponds to an averaged value of past real exposure values for selected wafers having same or similar item to said currently processing wafer;

rendering said compensated exposure value effective if said compensated exposure value is within said predetermined acceptable range; and rendering said compensated exposure value ineffective and determining to use a past-real used one of compensated exposure values if said compensated exposure value is not within said predetermined acceptable range.

* * * * *

UNITED STATES PATENT AND TRADEMARK OFFICE
CERTIFICATE OF CORRECTION

PATENT NO. : 6,599,670 B2
DATED : July 29, 2003
INVENTOR(S) : Ikuno et al.

Page 1 of 1

It is certified that error appears in the above-identified patent and that said Letters Patent is hereby corrected as shown below:

Title page,
Item [56], References Cited, FOREIGN PATENT DOCUMENTS, insert the following:
-- JP    10-261572    9/1998
   JP    9-237745     9/1997 --.

Signed and Sealed this

Seventeenth Day of February, 2004

JON W. DUDAS
*Acting Director of the United States Patent and Trademark Office*